(12) United States Patent
Soga

(10) Patent No.: US 10,637,410 B2
(45) Date of Patent: Apr. 28, 2020

(54) AMPLIFICATION DEVICE AND ELECTROMAGNETIC WAVE IRRADIATING DEVICE

(71) Applicant: FUJITSU LIMITED, Kawasaki-shi, Kanagawa (JP)

(72) Inventor: Ikuo Soga, Isehara (JP)

(73) Assignee: FUJITSU LIMITED, Kawasaki (JP)

(\*) Notice: Subject to any disclaimer, the term of this patent is extended or adjusted under 35 U.S.C. 154(b) by 0 days.

(21) Appl. No.: 16/238,593

(22) Filed: Jan. 3, 2019

(65) Prior Publication Data

US 2019/0238102 A1   Aug. 1, 2019

(30) Foreign Application Priority Data

Feb. 1, 2018   (JP) ................. 2018-016506

(51) Int. Cl.

| H03F 3/195 | (2006.01) |
|---|---|
| H03F 1/56 | (2006.01) |
| H03F 3/19 | (2006.01) |
| H03F 1/02 | (2006.01) |
| H05K 1/02 | (2006.01) |
| H01P 3/08 | (2006.01) |
| H05K 1/14 | (2006.01) |
| H03F 3/24 | (2006.01) |
| H03F 3/60 | (2006.01) |

(52) U.S. Cl.
CPC ............. *H03F 1/56* (2013.01); *H01P 3/08* (2013.01); *H03F 1/0205* (2013.01); *H03F 3/19* (2013.01); *H03F 3/245* (2013.01); *H03F 3/601* (2013.01); *H05K 1/0243* (2013.01); *H05K 1/144* (2013.01); *H03F 2200/387* (2013.01); *H03F 2200/451* (2013.01); *H05K 2201/041* (2013.01); *H05K 2201/10166* (2013.01); *H05K 2201/10378* (2013.01)

(58) Field of Classification Search
CPC .......................................... H03F 3/195
USPC ......................... 330/307, 302, 295
See application file for complete search history.

(56) References Cited

U.S. PATENT DOCUMENTS

| 3,694,746 A * | 9/1972 | Hopfer .......... G01R 21/00 324/95 |
| 5,394,124 A * | 2/1995 | Bartley .......... H01P 7/06 330/295 |
| 8,198,806 B2 * | 6/2012 | Yamazaki ...... H01L 27/3281 313/506 |

FOREIGN PATENT DOCUMENTS

| JP | 63-119307 | 5/1988 |
| JP | 09-252207 | 9/1997 |
| JP | 09-289365 | 11/1997 |

\* cited by examiner

*Primary Examiner* — Henry Choe
(74) *Attorney, Agent, or Firm* — Fujitsu Patent Center

(57) ABSTRACT

An amplification device includes a base metallic plate at a ground potential, an amplifier disposed on the base metallic plate, and including a plurality of transistors, and a matcher disposed on the base metallic plate so as to be coupled to the amplifier, the matcher performing impedance matching of output of the amplifier, wherein the matcher includes a first matching circuit board including a first dielectric board disposed on an upper surface of the base metallic plate, the first dielectric board having, on an upper surface, a transmission line coupled to an output electrode of the amplifier, and a second matching circuit board disposed so as to intersect the first matching circuit board, and disposed with a second dielectric board sandwiched by a first metallic film (Continued)

having one end coupled to the transmission line and having another end opened and a second metallic film at the ground potential.

15 Claims, 7 Drawing Sheets

AMPLIFICATION DEVICE AND ELECTROMAGNETIC WAVE IRRADIATING DEVICE

CROSS-REFERENCE TO RELATED APPLICATION

This application is based upon and claims the benefit of priority of the prior Japanese Patent Application No. 2018-16506, filed on Feb. 1, 2018, the entire contents of which are incorporated herein by reference.

FIELD

The embodiments discussed herein are related to an amplification device and an electromagnetic wave irradiating device.

BACKGROUND

Various methods are proposed for facilitating input-output impedance matching for an amplification device that amplifies a high frequency. In addition, for a higher efficiency of the amplification device, impedance matching of harmonics is performed in addition to impedance matching of a fundamental wave.

As an example, the impedance matching of the fundamental wave and the harmonics may be performed by a matcher including a transmission line coupled to an output electrode of an amplifier and an open stub having one end coupled to this transmission line. However, in this case, harmonic processing may not be performed in an excellent manner.

The followings are reference documents.
[Document 1] Japanese Laid-open Patent Publication No. 9-289365,
[Document 2] Japanese Laid-open Patent Publication No. 9-252207, and
[Document 3] Japanese Laid-open Patent Publication No. 63-119307.

SUMMARY

According to an aspect of the embodiment, an amplification device includes a base metallic plate at a ground potential, an amplifier disposed on the base metallic plate, the amplifier including a plurality of transistors, and a matcher disposed on the base metallic plate so as to be coupled to the amplifier, the matcher performing impedance matching of output of the amplifier, wherein the matcher includes a first matching circuit board including a first dielectric board disposed on an upper surface of the base metallic plate, the first dielectric board having, on an upper surface, a transmission line coupled to an output electrode of the amplifier, and a second matching circuit board disposed so as to intersect the first matching circuit board, and disposed with a second dielectric board sandwiched by a first metallic film having one end coupled to the transmission line and having another end opened and a second metallic film at the ground potential, the second matching circuit board being for use in harmonic impedance matching, the first metallic film is coupled to the transmission line so as to be substantially in parallel with the amplifier from one end side to another end side of the amplifier in a second direction intersecting a first direction in which the amplifier and the first matching circuit board are arranged.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Embodiments of the present technology will hereinafter be described with reference to the drawings.

First Embodiment

Figure 1:
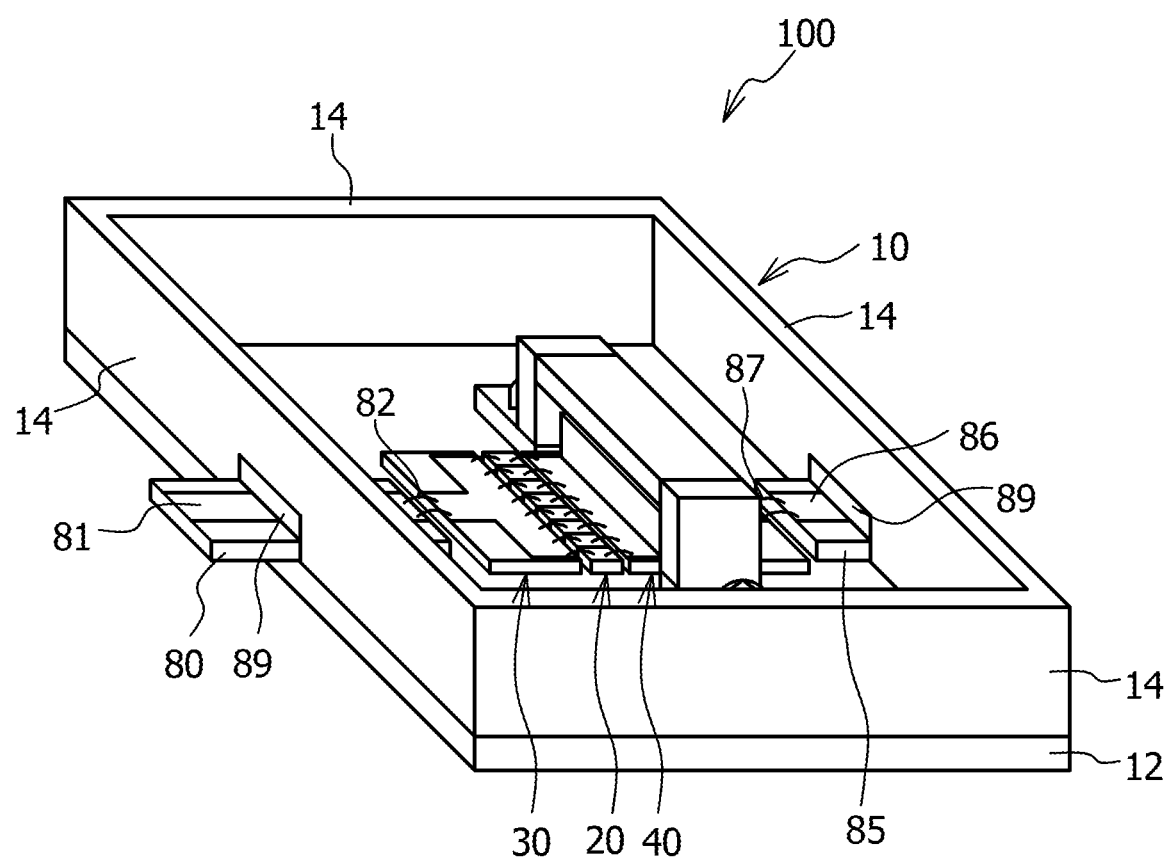
FIG. 1 is a perspective view of an amplification device according to a first embodiment.

FIG. 1 is a perspective view of an amplification device according to a first embodiment. As in FIG. 1, an amplification device 100 according to the first embodiment is provided with an amplifier 20, an input side matcher 30, and an output side matcher 40 within a casing 10 that includes a base metallic plate 12 and side walls 14. The base metallic plate 12 and the side walls 14 are formed of a metal such as copper or the like, and are at a ground potential. An input board 80 and an output board 85 are arranged so as to extend from an inside to an outside of the casing 10. An input electrode 81 electrically coupled to the input side matcher 30 by bonding wires 82 is disposed on the input board 80. An output electrode 86 electrically coupled to the output side matcher 40 by bonding wires 87 is disposed on the output board 85. The input electrode 81 and the output electrode 86 are used for coupling to external circuits. Insulating films 89 are interposed between the input electrode 81 and the side wall 14 and between the output electrode 86 and the side wall 14, so that the input electrode 81 and the output electrode 86 are not in contact with the casing 10.

Figure 2A:
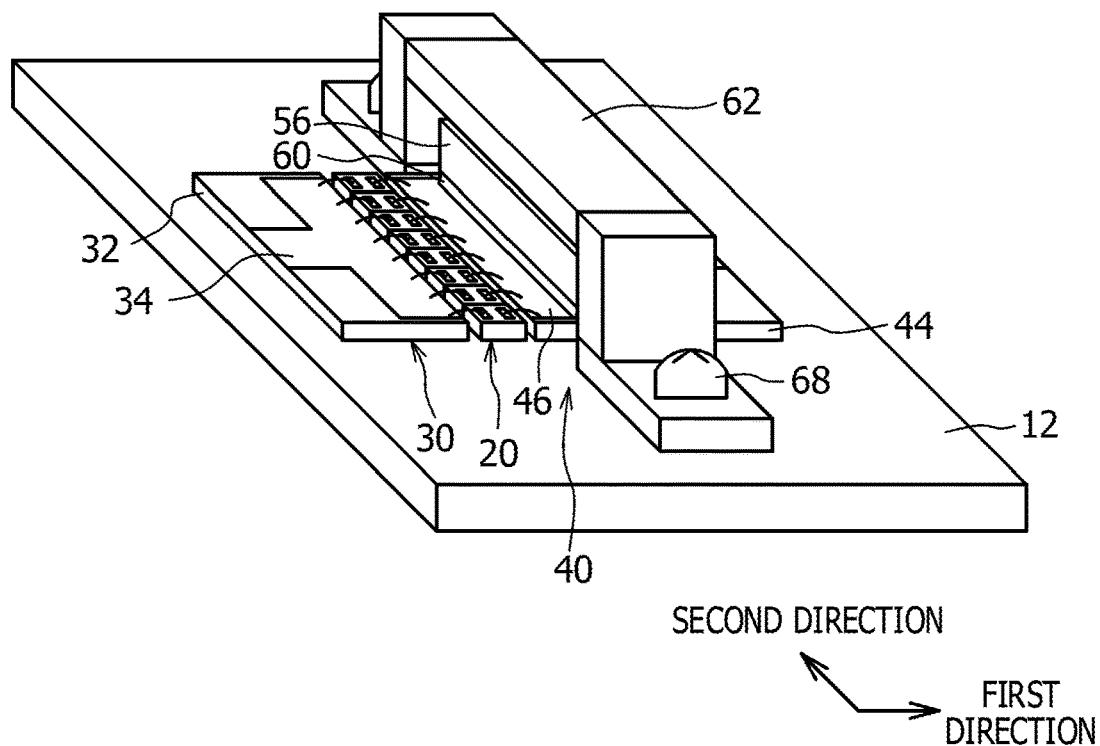
FIG. 2A and FIG. 2B are perspective views of an amplifier, an input side matcher, and an output side matcher in the first embodiment.
Figure 2B:
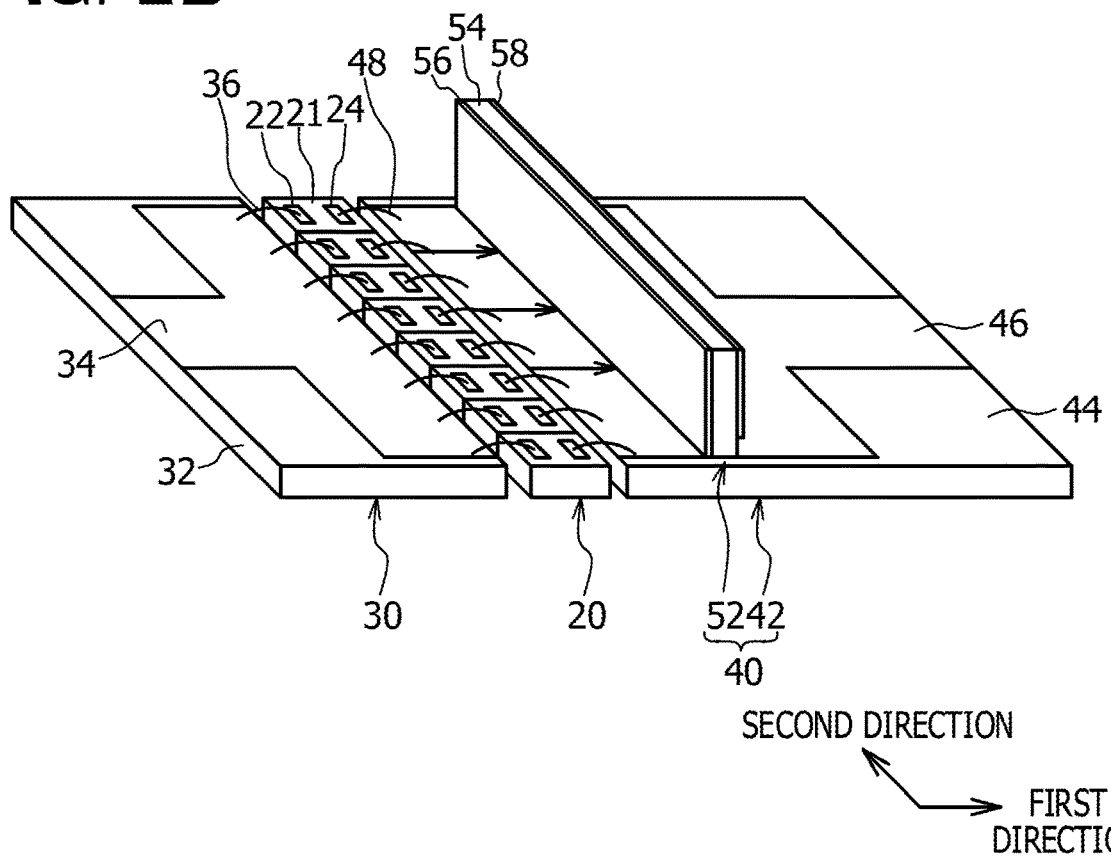
Figure 3A:
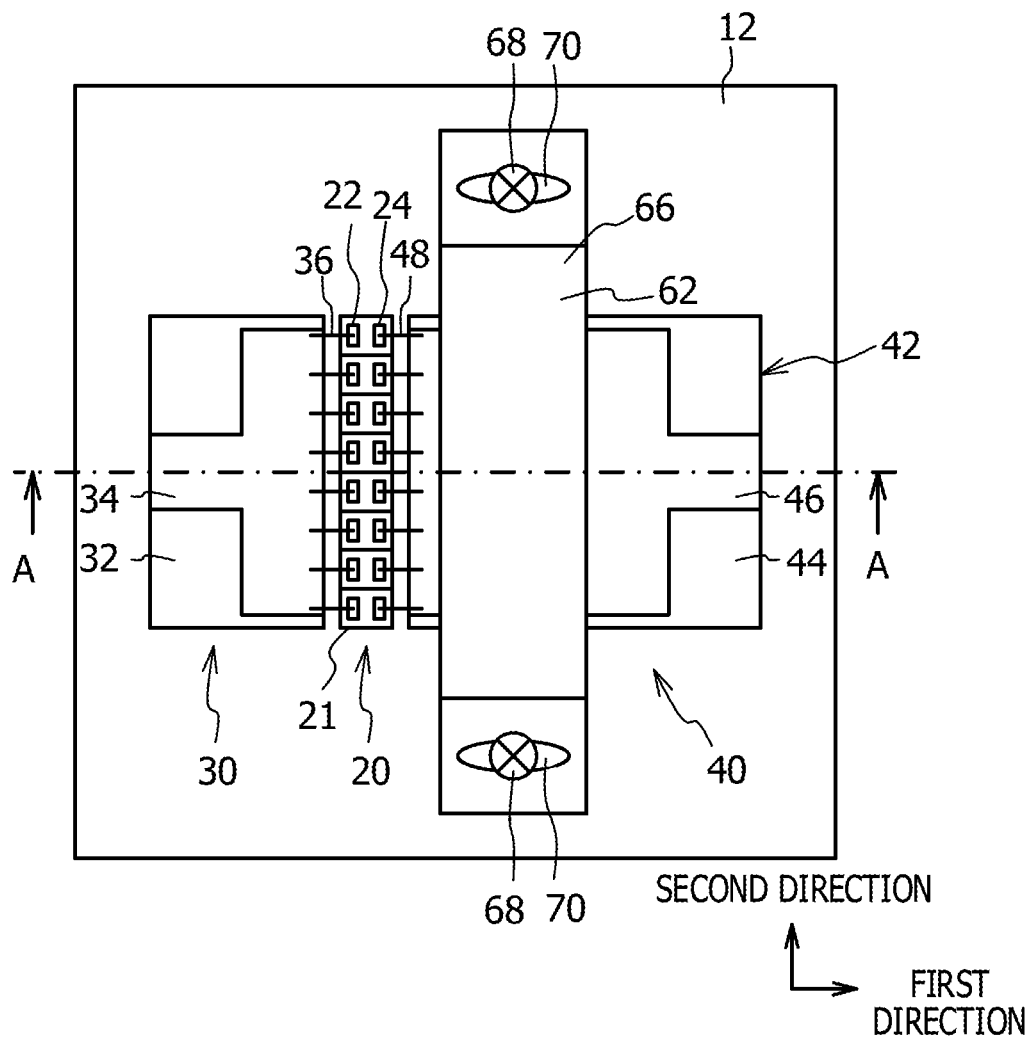
FIG. 3A is a top view of an amplifier, an input side matcher, and an output side matcher in the first embodiment.
Figure 3B:
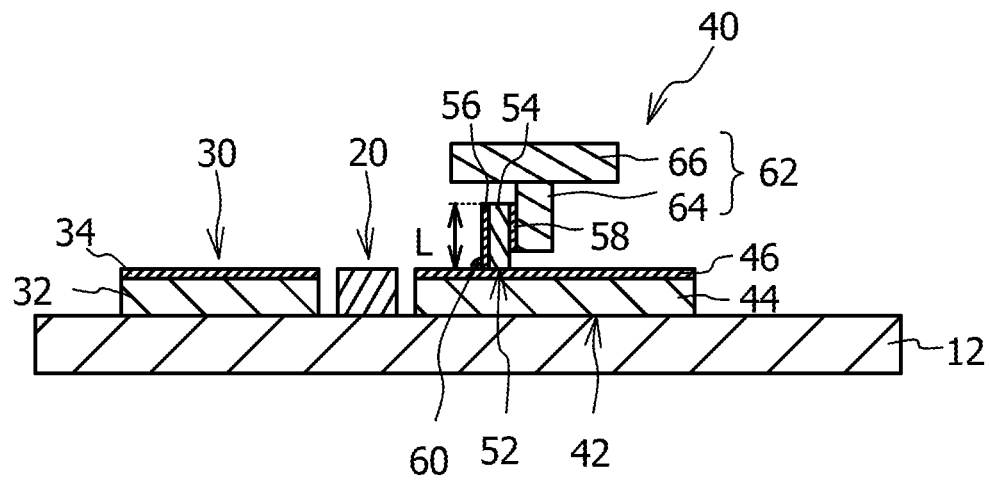
FIG. 3B is a sectional view taken along a line A-A of FIG. 3A.

FIG. 2A and FIG. 2B are perspective views of an amplifier, an input side matcher, and an output side matcher in the first embodiment. Incidentally, FIG. 2B is a diagram not illustrating a metallic member 62, fixing members 68, and joining members 60 in FIG. 2A. FIG. 3A is a top view of an amplifier, an input side matcher, and an output side matcher in the first embodiment. FIG. 3B is a sectional view taken along a line A-A of FIG. 3A. Incidentally, in the following, a direction in which the input side matcher 30, the amplifier 20, and the output side matcher 40 are arranged is set as a first direction, and a direction parallel with an upper surface of the base metallic plate 12 and intersecting (for example, orthogonal to) the first direction is set as a second direction.

As in FIGS. 2A to 3B, the amplifier 20, the input side matcher 30, and the output side matcher 40 are arranged on the base metallic plate 12. The amplifier 20 is a transistor chip in which a plurality of transistors 21 are integrated so as to be arranged in the second direction. The transistors 21 are, for example, a field-effect transistor. However, the transistors 21 may be another transistor such as a bipolar transistor or the like.

The input side matcher 30 includes a dielectric board 32 and a transmission line 34 disposed on an upper surface of the dielectric board 32. One end of the transmission line 34 is electrically coupled to the input electrode 81 by the bonding wires 82 (see FIG. 1). Another end of the transmission line 34 is electrically coupled to input electrodes 22 (gate electrodes) of the amplifier 20 by bonding wires 36. A lower surface of the dielectric board 32 is in contact with the base metallic plate 12. The input side matcher 30 performs impedance matching for a high-frequency (for example, microwave) fundamental wave processed by the amplification device 100 between the output impedance of the external circuit coupled to the input electrode 81 and the input impedance of the amplifier 20. The dielectric board 32 is, for example, an alumina board having a thickness of approximately 100 to 300 μm. The transmission line 34 is a wiring pattern formed of a metal such as gold, copper, or the like. The bonding wires 36 are metal wires such as a gold wire, a copper wire, or the like.

The output side matcher 40 includes a matching circuit board 42 and a matching circuit board 52 disposed in an intersecting manner on an upper surface of the matching circuit board 42. The matching circuit board 42 includes a dielectric board 44 disposed on the upper surface of the base metallic plate 12 and a transmission line 46 disposed on an upper surface of the dielectric board 44. The matching circuit board 52 includes a dielectric board 54 and metallic films 56 and 58 arranged so as to sandwich the dielectric board 54. The metallic film 56 is disposed on the whole of one side surface of the dielectric board 54. The metallic film 58 is disposed on a region other than a lower side region of another side surface of the dielectric board 54 so as not to be in contact with the transmission line 46. The dielectric boards 44 and 54 are formed of a same material, and are, for example, an alumina board having a thickness of approximately 100 to 300 μm. The transmission line 46 and the metallic films 56 and 58 are metallic patterns formed of a metal such as gold, silver, or the like.

One end of the transmission line 46 is electrically coupled to the output electrode 86 by the bonding wires 87 (see FIG. 1). Another end of the transmission line 46 is electrically coupled to output electrodes 24 (drain electrodes) of the amplifier 20 by bonding wires 48. The bonding wires 48 are metallic wires such as a gold wire, a copper wire, or the like. A lower surface of the dielectric board 44 is in contact with the base metallic plate 12. The transmission line 46 is disposed so as to extend from one end side to another end side of the amplifier 20 in the second direction. For example, the transmission line 46 is disposed so as to extend from a transistor 21 on one end side to a transistor 21 on another end side of the plurality of transistors 21 arranged in the second direction.

The metallic film 56 has one end coupled to the transmission line 46, and has another end opened. The one end of the metallic film 56 is joined to the transmission line 46 by a joining member 60 such as a conductive paste (for example, a silver paste), a solder, or the like. The metallic film 56 is disposed so as to extend from one end side to the other end side of the amplifier 20 in the second direction, for example, disposed so as to extend from the transistor 21 on one end side to the transistor 21 on the other end side of the plurality of transistors 21 arranged in the second direction. The metallic film 56 is coupled to the transmission line 46 so as to be substantially in parallel with the amplifier 20 from one end side to the other end side of the amplifier 20 in the second direction.

A surface of the metallic film 58 on an opposite side from the dielectric board 54 is joined with a metallic member 62 by a joining member such as a conductive paste, a solder, or the like. The metallic member 62 is, for example, formed of copper or the like. The metallic member 62 is fixed to the base metallic plate 12 by fixing members 68 such as screws or the like. The metallic film 58 is thereby at the ground potential. Because the dielectric boards 44 and 54 are formed of a same material, the metallic film 56 has a function of an open stub having one end coupled to the transmission line 46 and another end opened.

The metallic member 62 includes: a first part 64 joined to the metallic film 58 and disposed in parallel with the dielectric board 54; and a bridge-shaped second part 66 joined to an upper surface of the first part 64 and straddling the dielectric board 44 in the second direction. The second part 66 is provided with holes 70 opposed to the base metallic plate 12. The holes 70 have a larger shape in the first direction than the fixing members 68. The metallic member 62 is fixed to the base metallic plate 12 by inserting the fixing members 68 into the holes 70.

The output side matcher 40 performs impedance matching for a high-frequency fundamental wave processed by the amplification device 100 between the input impedance of the external circuit coupled to the output electrode 86 and the output impedance of the amplifier 20. The output side matcher 40 further performs impedance matching for a second harmonic having twice the frequency of the fundamental wave.

A length L between the one end of the metallic film 56, the one end being coupled to the transmission line 46, and the opened other end of the metallic film 56 is, for example, ⅛ of a wavelength in the fundamental wave of output of the amplifier 20. For example, the length L of the metallic film 56 is ¼ of a wavelength in the second harmonic generated from the amplifier 20.

A high-frequency signal input to the input electrode 81 is input to the input electrodes 22 of the amplifier 20 and amplified by the amplifier 20, after the input side matcher 30 matches the impedance of the fundamental wave. The high-frequency signal amplified by the amplifier 20 is output from the output electrodes 24 of the amplifier 20, and the output side matcher 40 matches the impedance of the fundamental wave and the second harmonic. The fundamental wave impedance-matched by the output side matcher 40 is output from the output electrode 86.

Figure 4:
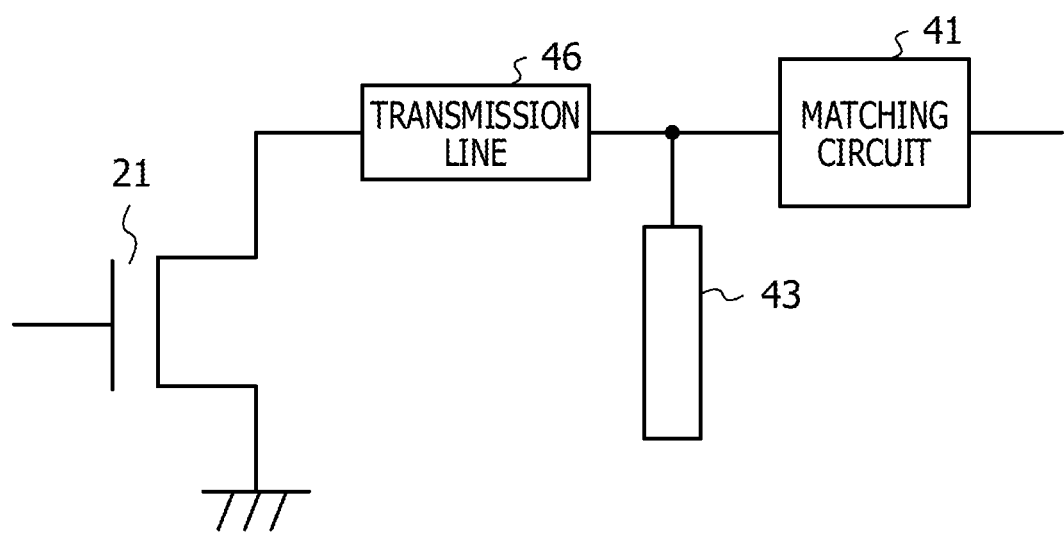
FIG. 4 is a circuit diagram illustrating an amplifier and an output side matcher.

FIG. 4 is a circuit diagram illustrating an amplifier and an output side matcher. As in FIG. 4, a matching circuit 41 formed in the output side matcher 40 is coupled to the drain electrode of a transistor 21 included in the amplifier 20 via the transmission line 46. One end of an open stub 43 formed of the metallic film 56 is coupled to the transmission line 46. Because the length L of the metallic film 56 is ¼ of the wavelength in the second harmonic generated from the amplifier 20, the line length of the open stub 43 is ¼ of the wavelength in the second harmonic.

Here, description will be made of reasons that the line length of the open stub 43 is set at ¼ of the wavelength in the second harmonic. Inverse class-F amplification is known as an excellent amplifying method in terms of efficiency of conversion of supplied power to high-frequency power. In the inverse class-F amplification, a transistor is operated such that a drain current at an output terminal of the transistor is a rectangular wave and a drain voltage is a half-wave rectified wave. From a Fourier transform, a fact is derived that the drain current of the rectangular wave is superimposition of odd-order harmonics and the drain voltage of the half-wave rectified wave is superimposition of even-order harmonics. Hence, by bringing the impedance of the even-order harmonics close to infinity, and bringing the impedance of the odd-order harmonics close to zero, it is possible to realize the inverse class-F amplification, and improve efficiency. It is desirable to adjust both the impedance of the even-order harmonics and the impedance of the odd-order harmonics. However, efficiency can be improved by adjusting only one of the impedance of the even-order harmonics and the impedance of the odd-order harmonics.

When the line length of the open stub 43 is set at ¼ of the wavelength in the second harmonic, the impedance of the open stub 43 is zero for the second harmonic. Because such an open stub 43 is coupled to the drain electrode of the transistor 21 via the transmission line 46, the impedance of the second harmonic when the matching circuit 41 is viewed from the transistor 21 can be made to appear to be high. It is thereby possible to achieve a near inverse class-F amplification, and improve efficiency of the amplification device 100.

Figure 5:
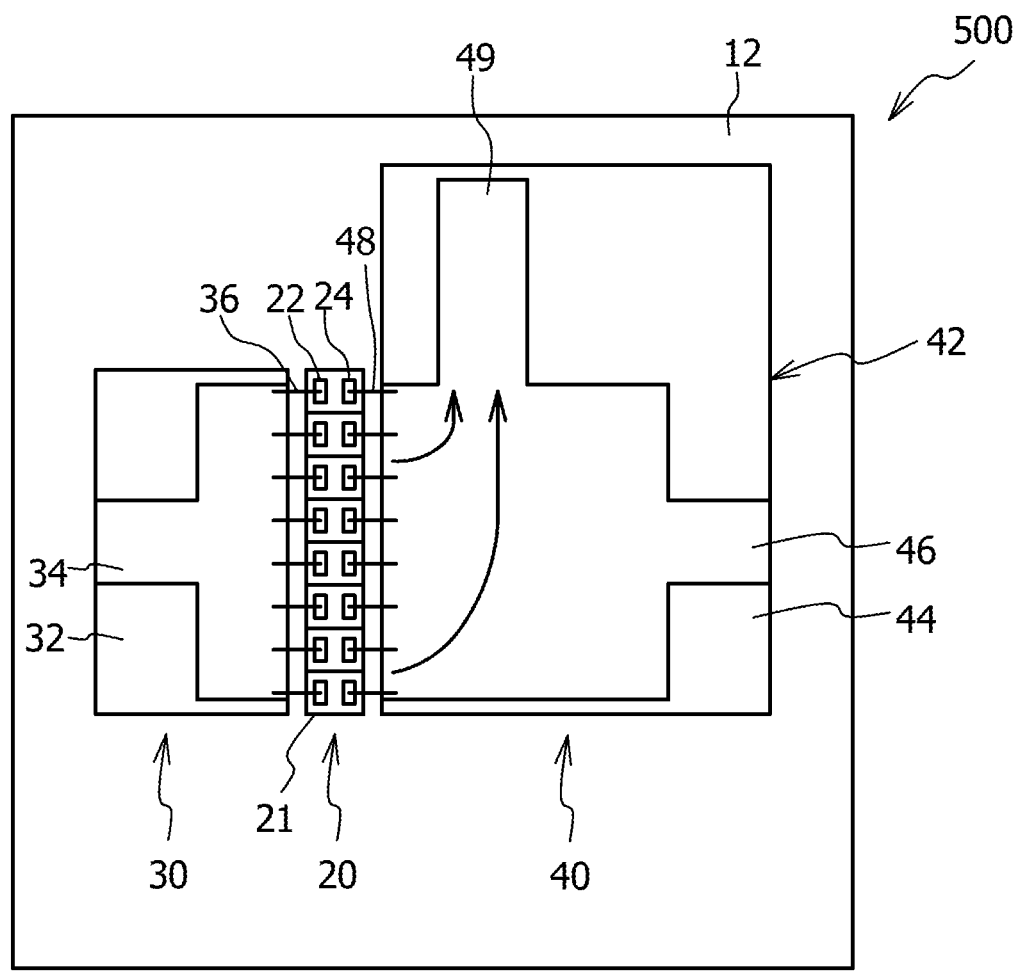
FIG. 5 is a top view of an amplification device according to a first comparative example.

FIG. 5 is a top view of an amplification device according to a first comparative example. As in FIG. 5, in an amplification device 500 according to the first comparative example, the output side matcher 40 does not include the matching circuit board 52 on the matching circuit board 42. A transmission line 46 and an open stub 49 having one end coupled to the transmission line 46 are arranged on the dielectric board 44 of the matching circuit board 42. The open stub 49 is disposed on the outside of the transmission line 46. The line length of the open stub 49 is, for example, ¼ of the wavelength in the second harmonic generated from the amplifier 20. The other configuration is the same as in the first embodiment, and therefore description thereof will be omitted.

In the amplification device 500 according to the first comparative example, the open stub 49 is disposed on the dielectric board 44 and on the outside of the transmission line 46. Therefore, as indicated by arrows, transmission line lengths from the plurality of transistors 21 of the amplifier 20 to the open stub 49 are different, and phase difference occurs. Therefore, it is difficult to perform harmonic processing in an excellent manner, and efficiency is decreased.

On the one hand, according to the first embodiment, as in FIG. 2B, the matching circuit board 52 is disposed on the upper surface of the dielectric board 44 so as to intersect the matching circuit board 42 on which the transmission line 46 is disposed. The matching circuit board 52 is a matching circuit board for impedance matching of the second harmonic, the matching circuit board being provided by sandwiching the dielectric board 54 by the metallic film 56 having one end coupled to the transmission line 46 and having another end opened and the metallic film 58 at the ground potential. The metallic film 56 is coupled to the transmission line 46 so as to be substantially in parallel with the amplifier 20 from one end side to the other end side of the amplifier 20 in the second direction. Thus, as indicated by arrows in FIG. 2B, transmission line lengths from the plurality of transistors 21 of the amplifier 20 to the metallic film 56 can be made similar to each other. Hence, it is possible to perform harmonic processing in an excellent manner, and improve efficiency. A result of obtaining efficiency of the amplification device 500 according to the first comparative example and efficiency of the amplification device 100 of the first embodiment by simulation, for example, indicates that the efficiency of the amplification device 100 according to the first embodiment is improved by approximately 6.5% as compared with the amplification device 500 according to the first comparative example. Incidentally, being substantially parallel includes a difference to a degree of a manufacturing error, and it suffices for the difference to be in a range in which harmonic processing can be performed in an excellent manner. For example, the inclination of the metallic film 56 with respect to the amplifier 20 is 10° or less, preferably 5° or less, more preferably 3° or less.

As in FIG. 3A and FIG. 3B, the output side matcher 40 preferably includes the metallic member 62 joined to the metallic film 58 and fixed to the base metallic plate 12 at the ground potential by the fixing members 68. The matching circuit boards 42 and 52 can be thereby coupled to a common ground. In addition, fixing the matching circuit board 52 to the base metallic plate 12 by the metallic member 62 can improve mechanical strength of the matching circuit board 52. From a viewpoint of the mechanical strength of the matching circuit board 52 or the like, it is preferable that the metallic member 62 straddle the matching circuit board 42 in the second direction and be fixed to the base metallic plate 12 on both sides in the second direction of the matching circuit board 42 by the fixing members 68.

As in FIG. 3A, the metallic member 62 is preferably fixed to the base metallic plate 12 by inserting the fixing members 68 into the holes 70 formed in the metallic member 62. The holes 70 preferably have a larger shape in the first direction than the fixing members 68. The position of the metallic film 56 with respect to the transmission line 46 can be thereby moved in the first direction, so that the adjustment of harmonic processing can be made easily.

As in FIG. 2A and FIG. 3B, the metallic film 56 is preferably joined to the transmission line 46 by the joining member 60 such as a conductive paste, a solder, or the like. As an example, after the adjustment is made by moving the position of the metallic film 56 with respect to the transmission line 46 in the first direction, the metallic member 62 is fixed to the base metallic plate 12 by the fixing members 68. The metallic film 56 is thereafter joined to the transmission line 46 by the joining member 60. It is thereby possible to improve electric coupling between the metallic film 56 and the transmission line 46.

As described with reference to FIG. 4, the metallic film 56 of the matching circuit board 52 preferably forms the open stub 43 having a line length that is ¼ of the wavelength in the second harmonic generated from the amplifier 20. For example, the metallic film 56 of the matching circuit board 52 preferably forms the open stub 43 having a line length that is ⅛ of the wavelength in the fundamental wave of the output of the amplifier 20. The impedance of the second harmonic when the matching circuit 41 is viewed from the transistor 21 can be thereby made to appear high, so that a near inverse class-F amplification can be achieved.

Second Embodiment

Figure 6:
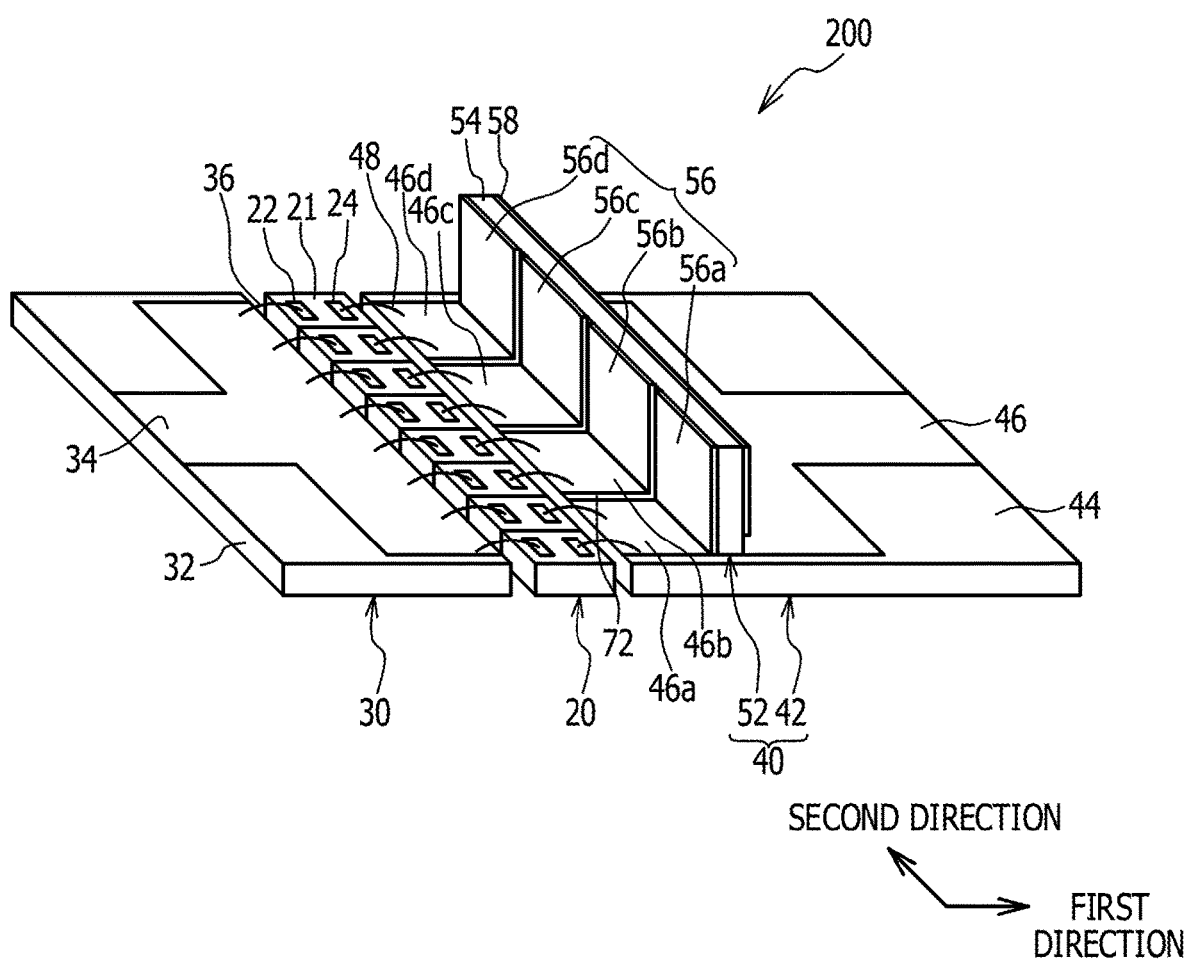
FIG. 6 is a perspective view of an amplifier, an input matcher, and an output matcher in a second embodiment.

FIG. 6 is a perspective view of an amplifier, an input matcher, and an output matcher in a second embodiment. Incidentally, FIG. 6 does not illustrate a metallic member 62, a joining member 60, and the like for the clarification of the figure. As in FIG. 6, in an amplification device 200 according to the second embodiment, a part of a transmission line 46, the part being located between an amplifier 20 and a metallic film 56, is divided into a plurality of line patterns 46a to 46d in a second direction by slits 72 extending in a first direction. The metallic film 56 is also divided into a plurality of metallic patterns 56a to 56d. The plurality of metallic patterns 56a to 56d are coupled to the plurality of line patterns 46a to 46d so as to correspond to the plurality of line patterns 46a to 46d. The other configuration is the same as in the first embodiment, and therefore description thereof will be omitted.

In the first embodiment, an unintended loop may occur between the plurality of transistors 21 via the transmission line 46, and as a result, an unintended oscillation can occur. Accordingly, in the second embodiment, the part of the transmission line 46, the part being located between the amplifier 20 and the metallic film 56, is divided into the plurality of line patterns 46a to 46d by the slits 72 extending in the first direction. The unintended loop between the plurality of transistors 21 via the transmission line 46 can be thereby suppressed, so that the unintended oscillation can be suppressed.

In addition, according to the second embodiment, the metallic film 56 is divided into the plurality of metallic patterns 56a to 56d coupled to the plurality of line patterns 46a to 46d so as to correspond to the plurality of line patterns 46a to 46d. The occurrence of the unintended loop between the plurality of transistors 21 can be thereby further suppressed.

In the first embodiment and the second embodiment, inverse class-F amplification is illustrated as an example. However, class-F amplification may be adopted. In the class-F amplification, a transistor is operated such that a drain voltage at an output terminal of the transistor is a rectangular wave and a drain current is a half-wave rectified wave. Hence, the class-F amplification can be realized by bringing the impedance of even-order harmonics close to zero and bringing the impedance of odd-order harmonics close to infinity. In this case, the metallic film 56 of the matching circuit board 52 preferably forms the open stub 43 having a line length that is $\frac{1}{12}$ of the wavelength in the fundamental wave of the output of the amplifier 20. The impedance of a third harmonic when the matching circuit 41 is viewed from the transistor 21 can be thereby made to appear high, so that a near class-F amplification can be achieved.

In the first embodiment and the second embodiment, the case where the dielectric boards 44 and 54 are formed of a same material is illustrated as an example. However, the dielectric boards 44 and 54 are not limited to this case. The dielectric board 54 may be formed of a material having a higher dielectric constant than the dielectric board 44. For example, the dielectric board 44 may be an alumina board, and the dielectric board 54 may be a zirconia board or a barium strontium titanate board. In this case, the matching circuit board 52 forms a high capacitance by the dielectric board 54 sandwiched by the metallic films 56 and 58. The capacitance formed by the dielectric board 54 is preferably a sufficiently high capacitance such as constitutes a negligible impedance with respect to the second harmonic or the third harmonic. For example, the capacitance formed by the dielectric board 54 is preferably a capacitance that constitutes a sufficiently low impedance with respect to the second harmonic or the third harmonic. In this case, the capacitance as the sufficiently low impedance with respect to the second harmonic or the third harmonic is coupled in place of the open stub 43 in FIG. 4, and the impedance of the second harmonic or the third harmonic when the matching circuit 41 is viewed from the transistor 21 can be made to appear high. Hence, a near inverse class-F amplification or a near class-F amplification can be achieved.

In the case where the capacitance as the sufficiently low impedance with respect to the second harmonic or the third harmonic is formed by the dielectric board 54, the metallic film 58 may be provided so as to be located only on an upper side of a center in a height direction of the dielectric board 54 (opposite side from the transmission line 46). A part of the metallic film 56, the part not being opposed to the metallic film 58, thereby constitutes an inductor. Thus, inductance adjustment can be made by the length of the part not opposed to the metallic film 58.

Third Embodiment

Figure 7:
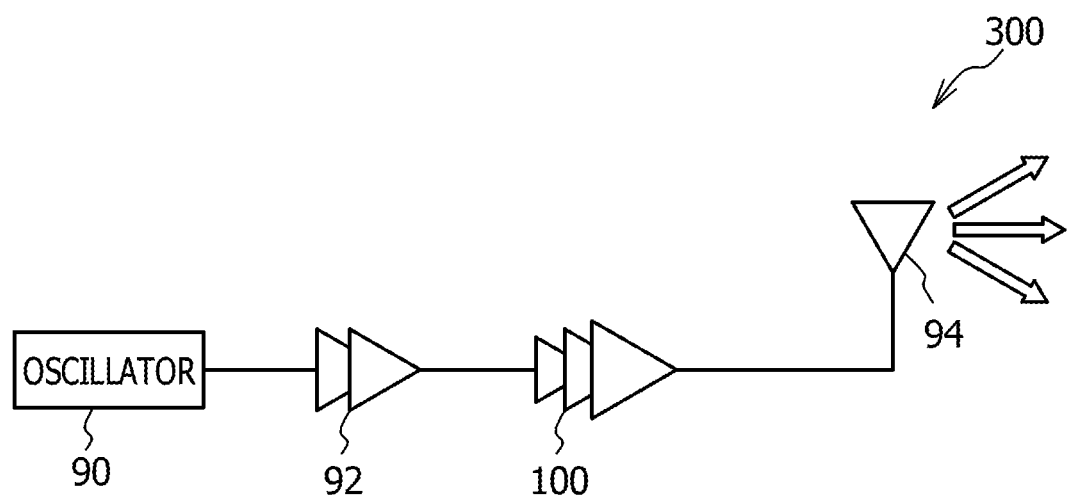
FIG. 7 is a diagram illustrating an electromagnetic wave irradiating device according to a third embodiment.

FIG. 7 is a diagram illustrating an electromagnetic wave irradiating device according to a third embodiment. As in FIG. 7, an electromagnetic wave irradiating device 300 according to the third embodiment includes an oscillator 90, a driver amplifier 92, the amplification device 100 according to the first embodiment, and an antenna 94. The oscillator 90 is, for example, a phase locked loop (PLL) oscillator. The oscillator 90 oscillates a high frequency (for example, a microwave). The driver amplifier 92 amplifies the high frequency oscillated by the oscillator 90. The driver amplifier 92 amplifies the high frequency to a power that can be driven by the amplification device 100. The amplification device 100 amplifies the high frequency amplified by the driver amplifier 92 to a given power. The antenna 94 radiates the high frequency amplified by the amplification device 100 to the outside.

The electromagnetic wave irradiating device 300 according to the third embodiment includes the amplification device 100 according to the first embodiment. The electromagnetic wave irradiating device 300 whose efficiency is improved is therefore obtained. Incidentally, while the case where the amplification device 100 according to the first embodiment is included is illustrated as an example in the third embodiment, the amplification device 200 according to the second embodiment may be included.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An amplification device comprising:
   a base metallic plate at a ground potential;
   an amplifier disposed on the base metallic plate, the amplifier including a plurality of transistors; and
   a matcher disposed on the base metallic plate so as to be coupled to the amplifier, the matcher performing impedance matching of output of the amplifier, wherein
   the matcher includes a first matching circuit board including a first dielectric board disposed on an upper surface of the base metallic plate, the first dielectric board having, on an upper surface, a transmission line coupled to an output electrode of the amplifier, and a second matching circuit board disposed so as to intersect the first matching circuit board, and disposed with a second dielectric board sandwiched by a first metallic film having one end coupled to the transmission line and having another end opened and a second metallic film at the ground potential, the second matching circuit board being for use in harmonic impedance matching, and the first metallic film is coupled to the transmission line so as to be substantially in parallel with the amplifier from one end side to another end side of the amplifier in a second direction intersecting a first direction in which the amplifier and the first matching circuit board are arranged.

2. The amplification device according to claim 1, wherein the matcher includes a metallic member joined to the second metallic film and fixed to the base metallic plate by a fixing member.

3. The amplification device according to claim 2, wherein the metallic member straddles the first matching circuit board in the second direction, and is fixed to the base metallic plate by the fixing member on both sides in the second direction of the first matching circuit board.

4. The amplification device according to claim 2, wherein the metallic member is fixed to the base metallic plate by inserting the fixing member into a hole formed in the metallic member, and the hole has a larger shape in the first direction than the fixing member.

5. The amplification device according to claim 1, wherein a part of the transmission line, the part being located between the amplifier and the first metallic film, is divided into a plurality of first patterns by a slit extending in the first direction.

6. The amplification device according to claim 5, wherein the first metallic film is divided into a plurality of second patterns coupled to the plurality of first patterns so as to correspond to the plurality of first patterns.

7. The amplification device according to claim 1, wherein the first metallic film is joined to the transmission line by a joining member.

8. The amplification device according to claim 7, wherein the joining member is a conductive paste or a solder.

9. The amplification device according to claim 1, wherein the first metallic film of the second matching circuit board forms an open stub having a line length that is $1/8$ or $1/12$ of a wavelength of a fundamental wave.

10. The amplification device according to claim 1, wherein the first dielectric board and the second dielectric board are formed of a same material.

11. The amplification device according to claim 1, wherein the second matching circuit board has a capacitance formed by the second dielectric board that is sandwiched by the first metallic film and the second metallic film and is formed of a material having a higher dielectric constant than the first dielectric board.

12. The amplification device according to claim 11, wherein the second dielectric board of the second matching circuit board forms the capacitance as a sufficiently low impedance with respect to a second harmonic or a third harmonic.

13. The amplification device according to claim 11, wherein the second metallic film is disposed so as to be located on an upper side of a center in a height direction of the second dielectric board.

14. The amplification device according to claim 1, wherein the plurality of transistors are a field-effect transistor or a bipolar transistor.

15. An electromagnetic wave irradiating device comprising:
an oscillator that oscillates a high frequency;
an amplifier that amplifies an output of the oscillator;
an amplification device that amplifies an output of the amplifier; and
an antenna that radiates an output of the amplification device,
wherein the amplification device including
a base metallic plate at a ground potential,
an amplifier disposed on the base metallic plate, the amplifier includes plurality of transistors, and
a matcher disposed on the base metallic plate so as to be coupled to the amplifier, the matcher performing impedance matching of output of the amplifier, and
wherein the matcher including
a first matching circuit board includes first dielectric board disposed on an upper surface of the base metallic plate, the first dielectric board having, on an upper surface, a transmission line coupled to an output electrode of the amplifier, and
a second matching circuit board disposed so as to intersect the first matching circuit board, and disposed with a second dielectric board sandwiched by a first metallic film having one end coupled to the transmission line and having another end opened and a second metallic film at the ground potential, the second matching circuit board being for use in harmonic impedance matching,
the first metallic film is coupled to the transmission line so as to be substantially in parallel with the amplifier from one end side to another end side of the amplifier in a second direction intersecting a first direction in which the amplifier and the first matching circuit board are arranged.

\* \* \* \* \*